United States Patent
Picco (10) Patent No.: US 10,023,461 B2
(45) Date of Patent: Jul. 17, 2018

(54) MICROINTEGRATED ENCAPSULATED MEMS SENSOR WITH MECHANICAL DECOUPLING AND MANUFACTURING PROCESS THEREOF

(71) Applicant: STMICROELECTRONICS S.R.L., Agrate Brianza (IT)

(72) Inventor: Andrea Picco, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/838,100

(22) Filed: Aug. 27, 2015

(65) Prior Publication Data

US 2016/0122181 A1    May 5, 2016

(30) Foreign Application Priority Data

Oct. 31, 2014   (IT) ............................. TO2014A0900

(51) Int. Cl.
  *H01L 21/46*   (2006.01)
  *H01L 29/84*   (2006.01)
  (Continued)

(52) U.S. Cl.
  CPC .......... *B81B 7/0058* (2013.01); *B81B 7/0048* (2013.01); *B81B 7/0051* (2013.01);
  (Continued)

(58) Field of Classification Search
  CPC ...................................................... H01L 29/84
  (Continued)

(56) References Cited

U.S. PATENT DOCUMENTS 6,131,466 A     10/2000  Vigna et al.
7,955,885 B1 *  6/2011   Bhugra ............... B81C 1/00301
                                               257/E21.499
(Continued)

FOREIGN PATENT DOCUMENTS

CN        1960580 A      5/2007
CN      103245377 A      8/2013
(Continued)

OTHER PUBLICATIONS

Barlian et al., "Review: Semiconductor Piezoresistance for Microsystems," *Proceedings of the IEEE* 97(3):513-552, Mar. 2009.
(Continued)

*Primary Examiner* — Moazzam Hossain
*Assistant Examiner* — Omar Mojaddedi
(74) *Attorney, Agent, or Firm* — Seed Intellectual Property Law Group LLP (57) ABSTRACT

The microintegrated sensor comprises a stack formed by a sensor layer, of semiconductor material, by a cap layer, of semiconductor material, and by an insulating layer. The sensor layer and the cap layer have a respective peripheral portion surrounding a central portion, and the insulating layer extends between the peripheral portions of the sensor layer and of the cap layer. An air gap extends between the central portions of the sensor layer and of the protection layer. A through trench extends into the central portion of the sensor layer as far as the air gap and surrounds a platform housing a sensitive element. The cap layer has through holes in the insulating layer that extend from the air gap and form a fluidic path with the air gap and the through trench.

25 Claims, 4 Drawing Sheets

(51) Int. Cl.
  *B81B 7/00* (2006.01)
  *B81C 1/00* (2006.01)
  *G01L 9/00* (2006.01)

(52) U.S. Cl.
  CPC ........ *B81C 1/00325* (2013.01); *G01L 9/0042* (2013.01); *B81B 2201/0257* (2013.01); *B81B 2201/0264* (2013.01)

(58) Field of Classification Search
  USPC .......................................................... 257/419
  See application file for complete search history.

(56) References Cited

U.S. PATENT DOCUMENTS

| | | | |
|---|---|---|---|
| 8,173,513 | B2 | 5/2012 | Villa et al. |
| 2012/0042731 | A1* | 2/2012 | Lin .................... B81C 1/00309 73/718 |
| 2013/0205899 | A1 | 8/2013 | Wu et al. |
| 2013/0221457 | A1* | 8/2013 | Conti .................. B81B 7/0061 257/416 |
| 2014/0217521 | A1* | 8/2014 | Johari-Galle ....... B81C 1/00134 257/415 |
| 2014/0299948 | A1* | 10/2014 | Wang .................. H04R 19/005 257/416 |
| 2015/0315016 | A1* | 11/2015 | Yoneoka ............. B81C 1/00269 438/51 |

FOREIGN PATENT DOCUMENTS

| | | |
|---|---|---|
| CN | 103347808 A | 10/2013 |
| CN | 103523745 A | 1/2014 |
| CN | 203519214 U | 4/2014 |
| EP | 0 822 398 A1 | 2/1998 |
| EP | 2 075 221 A2 | 7/2009 |
| EP | 1 577 656 B1 | 6/2010 |
| GB | 1 399 988 A | 7/1975 |

OTHER PUBLICATIONS

Krondorfer et al., "Packaging Effect on MEMS Pressure Sensor Performance," *IEEE Transactions on Components and Packaging Technologies* 30(2):285-293, Jun. 2007.

O'Neal et al., "Challenges in the Packaging of MEMS," International Symposium on Advanced Packaging Materials: Processes, Properties and Interfaces, Mar. 14-17, 1999, Braselton, GA, 7 pages.

Reynolds et al., "Packaging a piezoresistive pressure sensor to measure low absolute pressures over a wide sub-zero temperature range," *Sensors and Actuators* 83:142-149, 2000.

Waber et al, "Flip-chip packaging of piezoresistive barometric pressure sensors," Smart Sensors, Actuators, and MEMS, Apr. 24-26, 2013, Grenoble, FR, 8 pages.

Wang et al., "Package-friendly piezoresistive pressure sensors with on-chip integrated packaging-stress-suppressed suspension (PS$^3$) technology," *J. Micromech. Microeng.* 23:045027, 2013, 7 pages.

* cited by examiner

MICROINTEGRATED ENCAPSULATED MEMS SENSOR WITH MECHANICAL DECOUPLING AND MANUFACTURING PROCESS THEREOF

BACKGROUND

Technical Field

The present disclosure relates to a microintegrated encapsulated MEMS sensor with mechanical decoupling, and to the manufacturing process thereof.

Description of the Related Art

As is known, microintegrated sensors obtained using MEMS (Micro-Electro-Mechanical-Systems) technology are spreading on the market, by virtue of their ever-increasing reliability, low costs, and very small dimensions. For instance, U.S. Pat. No. 6,131,466 describes a microintegrated MEMS pressure sensor of a piezoresistive type and the manufacturing process thereof. Another microintegrated pressure sensor, both of a piezoresistive type and of a capacitive type, is described in U.S. Pat. No. 8,173,513.

Microintegrated sensors generally have packages intended to protect the internal structures of the sensor from the external environment, for example to reduce disturbance due to temperature, humidity, particles or elements that prevent operation thereof or deteriorate performance thereof and/or to increase the mechanical strength thereof.

On the other hand, the manufacture of the package may cause stresses that may adversely affect the characteristics of performance, stability, and reliability of the sensor.

This is particularly true for sensors based upon piezoresistive characteristics of silicon, wherein the stresses are directly involved in the transduction mechanism. In these cases, then, an accurate design of the package is particularly desirable in order to limit the effects of stress caused by the package and by the assembly process, with particular attention as regards to the materials used and the effects arising during mechanical coupling between the sensor and the package.

For instance, the process of packaging by molding, which is the most commonly used in microelectronics, by virtue of its low costs and high throughput, may not be simply adopted, since it generates high stresses during resin injection and cooling.

The above undesirable effects become increasingly more important as the sizes of the dice and the packages increase and limit use of 3D packaging techniques.

In the past, various low-stress encapsulation solutions have been proposed and adopted. In some of these, the package comprises mechanical structures intended to also decouple the sensor from the surrounding environment. However, these solutions may also be improved.

BRIEF SUMMARY

One or more embodiments of the present disclosure are directed to a microintegrated encapsulated MEMS sensor that may overcome one or more of the drawbacks of the prior art.

According to one embodiment the present disclosure, a microintegrated encapsulated MEMS sensor is provided. The microintegrated encapsulated MEMS sensor includes a layer stack having a first main surface and a second main surface. The layer stack includes a sensor layer, a cap layer, and an insulating layer. The sensor layer and the cap layer having respective peripheral portions surrounding respective central portions. The insulating layer extends between the peripheral portions of the sensor layer and of the cap layer. An air gap extends between the central portions of the sensor layer and of the cap layer. A plurality of through trenches extends into the central portion of the sensor layer and collectively surrounds a platform housing a sensitive element. The cap layer includes a plurality of through holes that form a fluidic path to the sensitive element, along with the air gap and the plurality of through trenches.

BRIEF DESCRIPTION OF THE SEVERAL VIEWS OF THE DRAWINGS

For a better understanding of the present disclosure, preferred embodiments thereof are now described purely by way of non-limiting example, with reference to the attached drawings, wherein.

DETAILED DESCRIPTION

Figure 1:
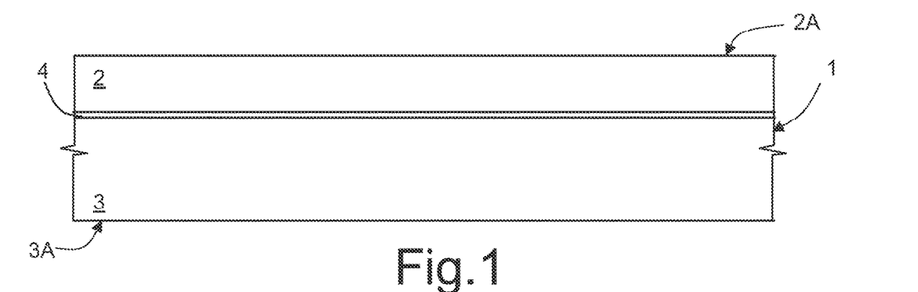
FIGS. 1-4 show cross-sections through a semiconductor material wafer in successive manufacturing steps of a microintegrated sensor according to an embodiment of the present process.

FIG. 1 shows a cross-section of a wafer 1 of semiconductor material in an initial step of the process.

The wafer 1 is a SOI (Silicon-On-Insulator) wafer comprising a first and a second structural layer 2, 3 of monocrystalline silicon separated by an insulating layer 4 of silicon oxide. The structural layers 2 and 3 have respective main surfaces 2A, 3A. The thickness of the structural layers 2 and 3 and of the insulating layer 4 is, for example, 50-100 µm, 400-600 µm, 2-3 µm respectively, so that the total thickness of the wafer 1 may be comprised approximately between 450 and 700 µm.

Figure 2:
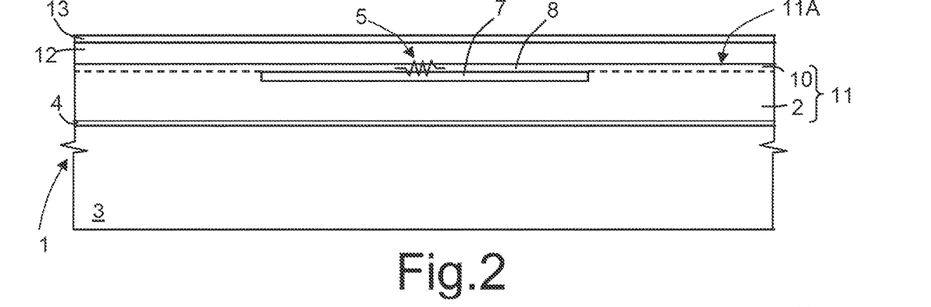

In a sensitive portion of the wafer 1, a sensitive element 5, for example a piezoresistive pressure sensor, is then formed, as represented schematically in FIG. 2. To this end, a cavity 7 is formed within the first structural layer 2 and delimits, at the bottom, a portion of the first structural layer 1 forming a membrane 8. For instance, the membrane 8 may have a thickness comprised between 2 and 20 µm.

The cavity 7 may be made in various known ways, except for bulk machining processes that involve the second structural layer 3. For instance, it may be formed similarly to what described in the aforementioned U.S. Pat. No. 8,173,513 for a standard wafer of monocrystalline silicon. In particular, the second structural layer 2 may be etched in the area of the sensitive element 5 for forming a grid of pillars surrounded by a trench, in a manner not illustrated. An epitaxial growth is then carried out in a deoxidizing environment, causing growth, on the main surface 2A of the second structural layer 2, of an epitaxial layer 10, which closes the trench surrounding the pillars at the top. At the end of the growth, the epitaxial layer 10 is in fact undistinguishable from the second structural layer 2 and forms with the latter a sensor layer 11 having a surface 11A. An annealing step is then carried out such as to cause a complete migration of the silicon atoms of the pillars and formation of the cavity 7, closed at the top by the membrane 8. The contacts are formed in peripheral areas of the membrane 8, in a per se known manner not illustrated, to form the sensitive element 5 of a piezoresistive type. Further known steps then follow to form the electrical connection, in a known manner, not illustrated.

A passivation layer 12 of dielectric material, for example silicon oxide, silicon oxynitride or silicon nitride, is formed on the surface 11A of the sensor layer 11, and a first protective layer 13 is preferably formed on the passivation layer 12, the first protective layer 13 being of a material that is able to resist hydrofluoric acid, for example silicon carbide or aluminum oxide. For example, the first protective layer 13 may have a thickness comprised between 100 and 300 nm.

Figure 3:
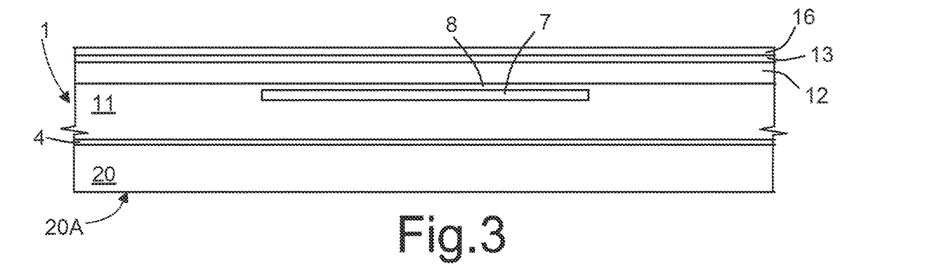

As shown in FIG. 3, the second structural layer 3 is thinned. To this end, a second protective layer 16, for example a polymeric ribbon, is deposited on top of the first protective layer 13. The second structural layer is thinned by a mechanical grinding step, to reach a thickness comprised approximately between 300 and 350 µm, thus forming a cap layer 20 having a surface 20A.

Figure 4:
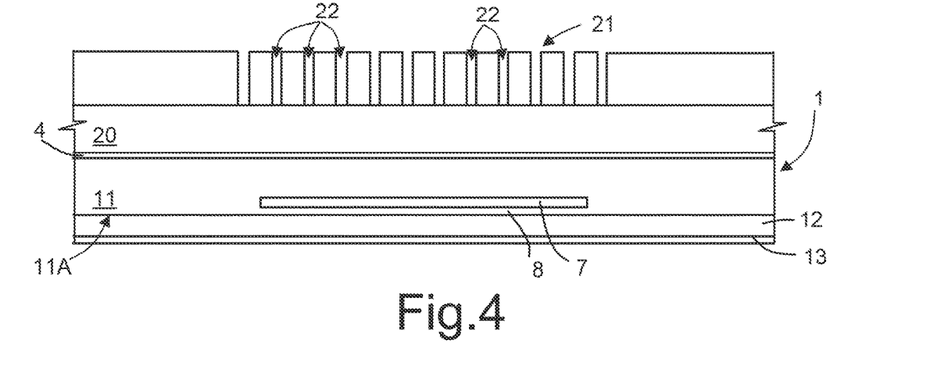
Figure 5:
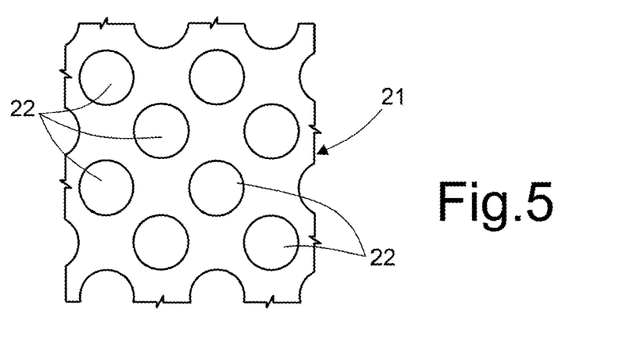
FIG. 5 shows the layout of a mask used in the step of FIG. 4.

Referring to FIG. 3, the surface 20A of the cap layer 20 is polished in the presence of the second protective layer 16, which protects the surface 11A and prevents damage thereof. Thereafter, the second protective layer 16 is removed as shown in FIG. 4. Via a photolithographic process, a hole mask 21, having a series of openings 22, is formed on the surface 20A of the cap layer 20 as shown in FIG. 4. The openings 22 of the hole mask 21 may have any shape, for example square, hexagonal, generically polygonal, or even circular. For instance, FIG. 5 shows an example of hole mask 21 wherein the openings 22 have a circular shape. The openings 22 have dimensions such that the holes to be formed in the cap layer 20 have a maximum width-to-depth dimensional ratio comprised between 1:5 and 1:20.

Alignment marks may be present on the surface 11A of the sensor layer 11 to enable alignment, on the opposite side of the wafer 1 (surface 20A of the cap layer 20), of the hole mask 21, for example via infrared transmission techniques.

Figure 6:
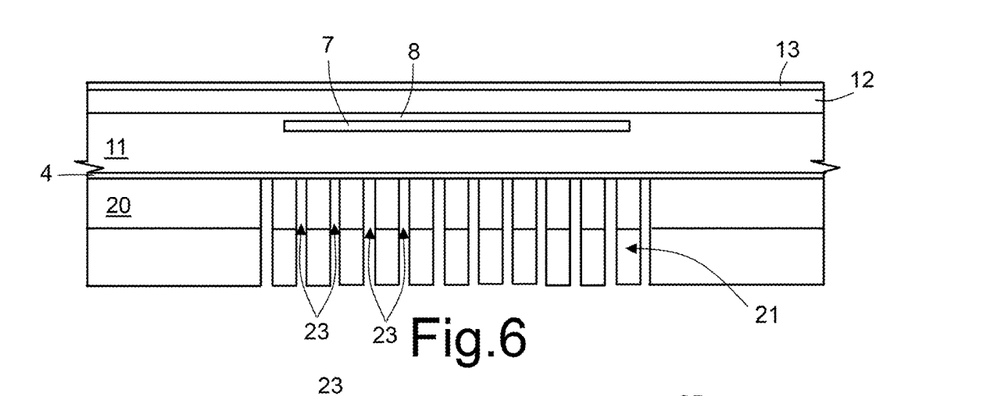
FIGS. 6-8 show cross-sections through the semiconductor material wafer of FIGS. 1-4, in further manufacturing steps.

Using the hole mask 21, the cap layer 20 is etched as shown in FIG. 6. For instance, a trench etch of a deep anisotropic type in an $SF_6$ plasma may be carried out. The etch terminates on the insulating layer 4, which thus acts as an etch stop, forming a plurality of holes 22 in the cap layer 20.

Figure 7:
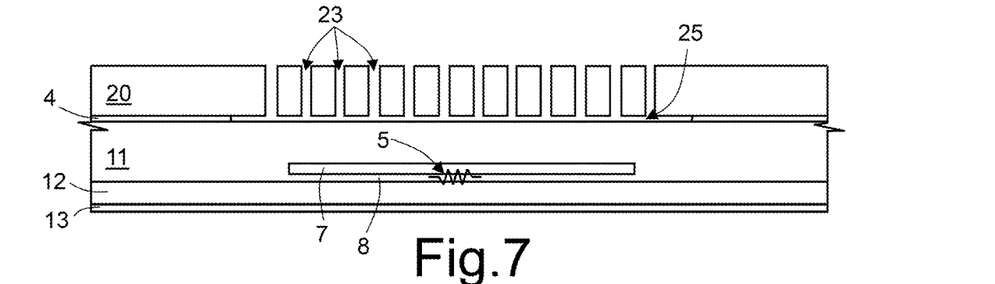

After removing the hole mask 21 as shown in FIG. 7, part of the insulating layer 4 is removed. For instance, the insulating layer 4 may be removed using HF vapors passing through the holes 22. In this step, the sensor layer 11 is still protected by the passivation layer 12 and is thus not damaged. Removal of the insulating layer 4 is obtained for example in a timed way for removing a controlled portion thereof, over the membrane 8 and along its sides, in the area where springs are to be obtained for decoupling the sensor area from the rest of the wafer 1, as explained hereinafter. An air gap 25 is thus formed between the sensor layer 11 and the cap layer 20, which is wider than the membrane 8.

Figure 8:
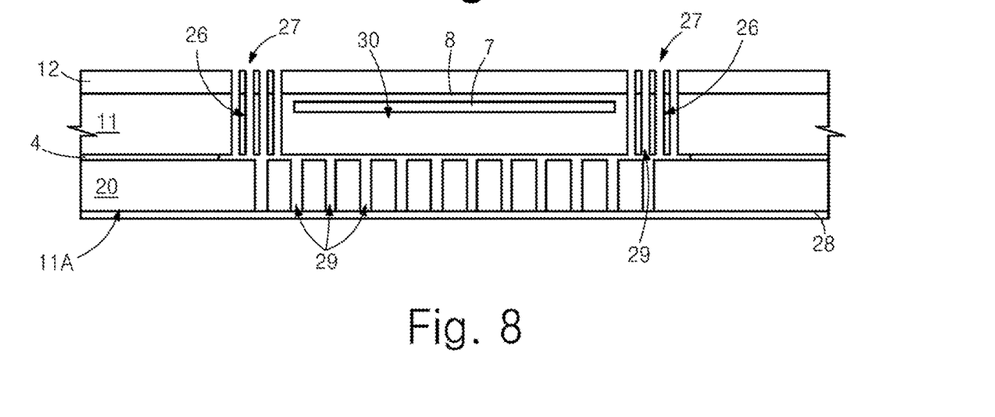
Figure 9:
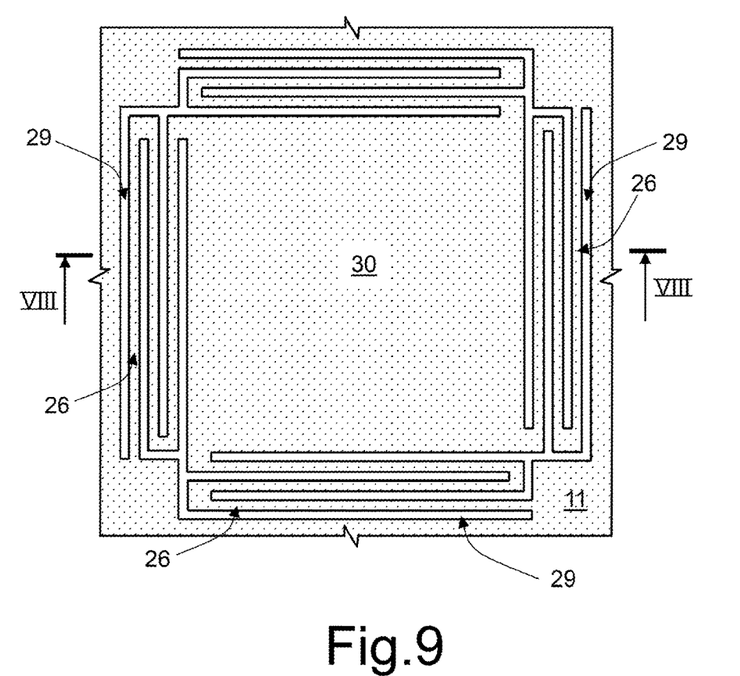
FIG. 9 is a top plan view of the a sensor area of the wafer of FIG. 8.

Referring to FIG. 8, the first protective layer 13 is removed, and springs 26 are defined that decouple a platform 30 from the rest of the sensor layer 11. To this end, using standard photolithographic techniques, the passivation layer 12 is defined, thus forming a hard mask 27. If useful for the envisaged handling machine, a third protective layer 28, for example a polymeric ribbon, may be laid over the surface 20A of the cap wafer 20 to prevent the presence of through openings and ensure the conditions of vacuum envisaged in some types of machines. Then, using the hard mask 27, a silicon etch is carried out, e.g., via time-controlled anisotropic dry silicon etching. The exposed portions of the sensor layer 11 are thus removed throughout the thickness to form the springs 26, as well as a trench 29 that surrounds the platform 30 as shown in FIG. 9. In this way, the platform is physically separated from the rest of the wafer 1 by the trench 29 except for the connection through the springs 26, which suspend the platform 30 and decouple it from the rest of the wafer 1 by virtue of their elasticity. In the illustrated embodiment, the trench 29 is a plurality of trenches 29a, 29b, 29c, and 20d that form the springs 26 and the plurality of trenches collectively surround the platform 30. For instance, as best shown in FIG. 9, each of the plurality of trenches 29a, 29b, 29c, and 29d is formed along two adjacent sides of the platform. In the illustrated embodiment, the plurality of trenches completely surround the platform 30, however, it is to be appreciated that in some embodiments, the plurality of trenches do not completely surround the trench, but rather substantially surround the platform. For instance, in one embodiment the trenches may be formed along sides of the platform but not connected at the corners between adjacent sides.

The wafer 1 of FIG. 8 may then be diced for obtaining a plurality of dice, each including a platform 30, which are ready to be fixed to other dice or wafers, or fixed to other wafers and subsequently cut and provided with a package.

In either case, the third protective layer 28 on the surface 11A of the sensor layer 11 may be left in order to facilitate handling using subsequent machines (for example, testing machines) or removed.

Figure 10:
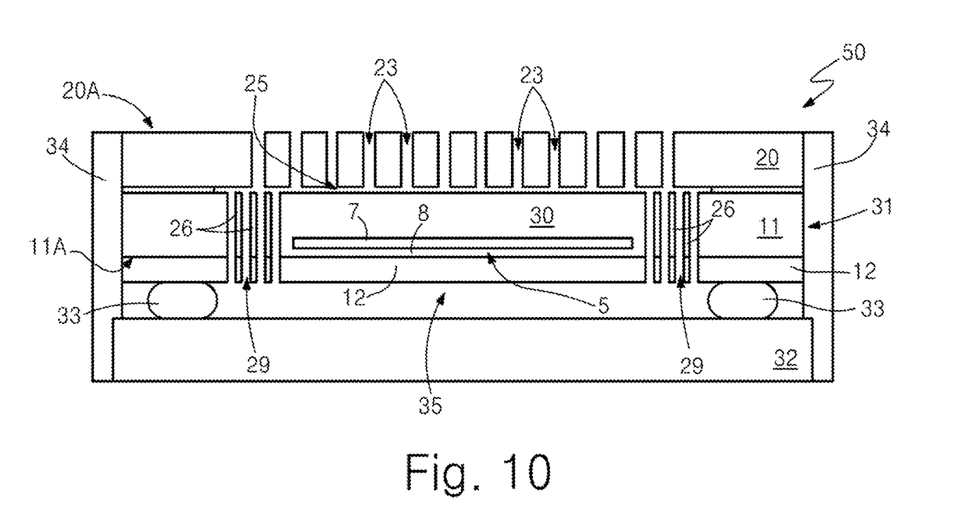
FIG. 10 shows a cross-section through an encapsulated sensor obtained with the process of FIGS. 1-10.

For instance, according to an embodiment illustrated in FIG. 10 (flip-chip package), the wafer 1 is diced for obtaining a sensor die 31, the sensor die 31 is fixed to an ASIC 32, the third protective layer 28 is removed, and the ensemble is packaged using a full-molding technique, with formation of an encapsulation region 34, of resin, on the sides of the sensor die 31 and of the ASIC 32. An electronic sensor 50 is thus obtained. Molding is carried out using the full-molding technique in an appropriate molding chamber that enables the top silicon to be kept exposed at the surface. In this way, covering of the area with the holes 23 by the encapsulation resin 34 is prevented.

In particular, here the sensor die 31 is fixed to the ASIC 32 via microbumps 33, which also ensure (through electrical-connection structures inside and/or on top of the sensor layer 11 and openings in the passivation layer 12) electrical connections between the sensor element 5 and the circuits integrated in the ASIC 32. Here, the microbumps 33 further form spacers between the ASIC 32 and the membrane 8. A gap 35 is then formed between them and constitutes, together with the holes 23, the air gap 25 and the trench 29, a fluidic path that extends between the membrane 8 and the outside of the microintegrated sensor 50.

Figure 11:
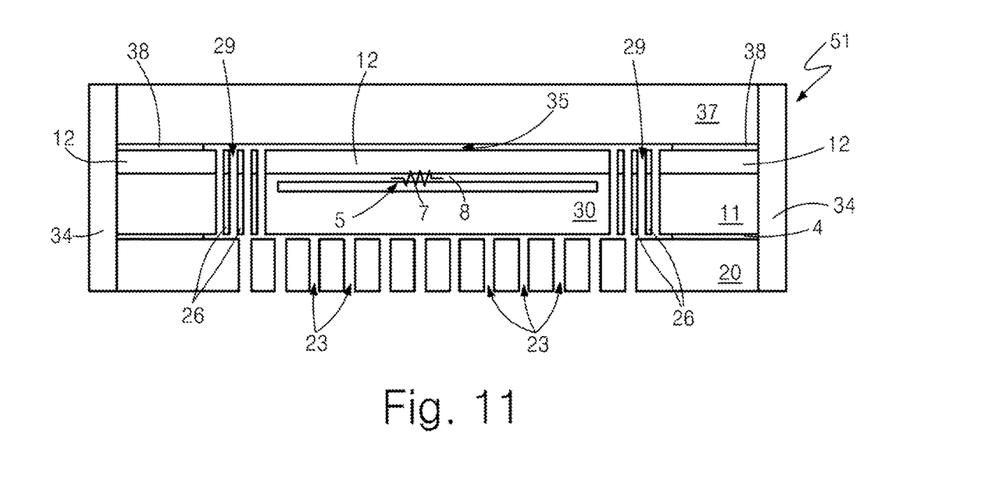
FIG. 11 shows a cross-section through another encapsulated sensor obtained with the process of FIGS. 1-8.

In another embodiment illustrated in FIG. 11, the third protective layer 28 is removed, the wafer 1 is fixed to a protective body 37, for example a silicon wafer, and is then diced, and the ensemble is packaged using a full-molding technique to form a microintegrated sensor 51. In this way, also in this case, during molding of the encapsulation resin 34, the sensor element 5 is protected by a protective body 37 forming a second cap. Furthermore, here, the material 38 for fixing the wafer 1 to the protective body 37 causes the gap 35 to be formed between the protective body 37 and the membrane 8.

In either solution, the microintegrated sensor 50 or 51 comprises a stack having a first main surface 11A and a second main surface 20A and formed by the sensor layer 11, of semiconductor material, facing the first main surface 11A, by the cap layer 20, of semiconductor material, facing the second main surface 20A, and by the insulating layer 4. The sensor layer 11 and the cap layer 20 have a respective peripheral portion surrounding a central portion, and the insulating layer 4 extends between the peripheral portions of the sensor layer and of the cap layer. An air gap 25 extends between the central portions of the sensor layer 11 and of the protection layer 20. A through trench 29 extends into the central portion of the sensor layer 11 between the first main surface 11A and the air gap 25 and surrounds a platform 30 housing a sensitive element 5. The cap layer 20 has through holes 23 extending between the air gap 25 and the second main surface 20A and forming a fluidic path with the air gap 25, the trench 29 and the gap 35.

In practice, in both the illustrated embodiments, the holes 23 in the cap layer 20 enable connection of the sensor element 5 with the external environment and thus, through the air gap 25, the trench 29 and the gap 35, for example for detecting the pressure in the environment surrounding the microintegrated sensor 50 or 51.

In the above structure, the membrane 8 is protected at the front via a body (ASIC 32 or protective body 37), without the need for this body to be perforated or undergo particular machining operations for enabling fluidic connection of the membrane 8 with the outside world.

With the illustrated solution, it is further possible to use packaging techniques with high intrinsic stress, such as full molding, without any damage to the sensitive part and/or without jeopardizing proper operation thereof.

In fact, any possible stresses on the die 31, for example induced by molding, may be absorbed elastically through the springs 26 that thus mechanically decouple the platform 30 from the rest of the sensor layer 11. It follows that the sensitive element 5 is subject only, to a first approximation, to the forces transmitted in the fluid means (generally, air) in which the sensor is immersed and is thus able to reliably detect the effects of the these forces, for example the ambient pressure, without being sensibly disturbed by other forces generally acting on the die 31.

With the encapsulation solution illustrated in FIG. 9 (flip-chip package), it is further possible to relieve any stresses due to the encapsulation step due to the bump-soldering process.

Execution of the etch for defining the platform 30 and the springs 26 from the back, through the cap layer 20, enables suitable results of stress relief, without providing operations for perforating the sensor layer 11, which would be problematic since, the considered central area accommodates the membrane 8 and the sensor element 5, which may not be perforated, and without passing through the trench 29, which would not ensure good removal results, since the insulating layer 4 would be removed also in the proximity of the peripheral area of the sensor, in a remote position with respect to the membrane 8, before complete release of the platform 30. Instead, removal through a plurality of holes 23 from the back enables optimal removal of the portion of the insulating layer 4 underneath the platform 30 and only to a minor extent outside the latter.

The steps used for defining the platform and the springs 26 are typical of front-end machining, such as anisotropic deep silicon trench etching and removal of insulating layers via HF vapors, and thus are well-known and controllable processes that have a good reliability and repeatable results.

Use of SOI substrates makes it possible to have already available a supporting and protection layer (cap layer 20), without the need for purposely designed fixing steps.

Encapsulation may be carried out via flip-chip processes and 3D stacking without using soft glues or buffer structures, which are normally used to reduce the effects of encapsulation.

Figure 12:
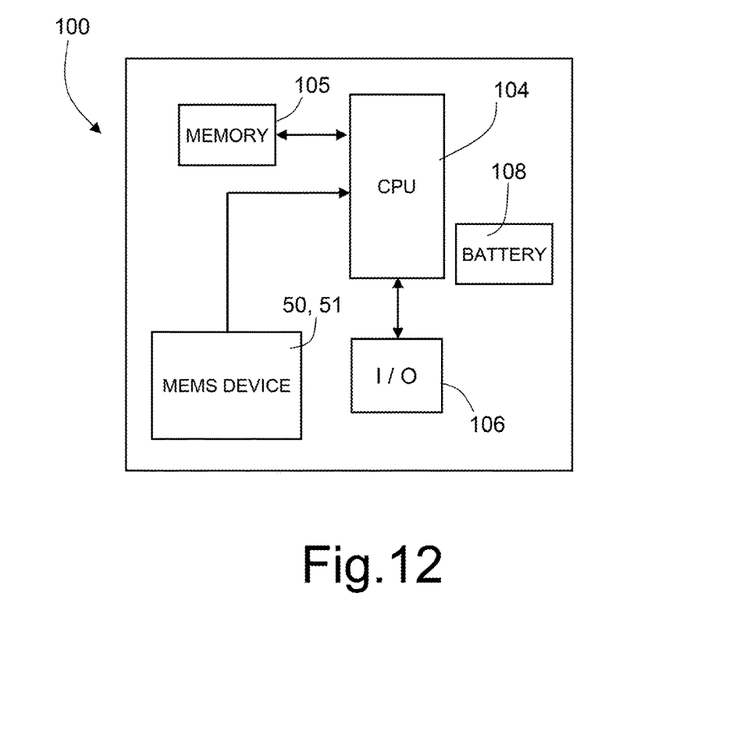
FIG. 12 shows a block diagram of an electronic device including the microintegrated sensor of FIGS. 10 and 11.

FIG. 12 shows a block diagram of an electronic device 100 that comprises at least one microintegrated sensor 50 or 51, as illustrated in FIG. 10 or FIG. 11. The electronic device 100 further comprises a microprocessor (CPU) 104 coupled to the microintegrated device 50 or 51. The electronic device 100 may further comprise a memory 105 coupled to the microprocessor 104 and an input/output interface 106, such as a keypad or a screen, also coupled to the microprocessor 104. Furthermore, the electronic device 100 may comprise a power-supply source 108, such as a battery, or a structure for coupling to an external power-supply source. The electronic device 100 may be any electronic device 100 that includes a microintegrated device illustrated in FIG. 10 or 11. For instance, the electronic device 100 may be a cellphone, a personal digital assistant (PDA), a wearable device, a voice recorder, an alarm clock, or the like.

Finally, it is clear that modifications and variations may be made to the sensor and to the manufacturing process described and illustrated herein, without departing from the scope of the present disclosure. For instance, the order of the steps for defining the platform 30 and the springs 26 and for opening the holes 23 may be reversed, if the used treatment machines so allow, or partial removal of the insulating layer 4 may be carried out after defining the platform 30 and springs 26. As mentioned, fixing of the sensor 31 to the protective body 37 or to another die may be made at wafer level or after cutting, and the fixing technique may vary according to specifications.

The membrane 8 may be obtained via any appropriate process that does not envisage machining of the cap layer; for instance, it may be obtained in a layer deposited or grown on the sensor layer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microintegrated sensor comprising:
   a stack having a first surface and a second surface, the stack including:
      a sensor layer at the first surface, the sensor layer including a first surface and second surface opposite the first surface, the sensor layer including a peripheral portion surrounding a central portion, the central portion including a platform housing a sensitive element;
      a cap layer at the second surface, the cap layer including a peripheral portion and a central portion, the central portion of the cap layer including a plurality of through holes;

an insulating layer located between the peripheral portions of the sensor layer and of the cap layer;

an air gap located between the central portions of the sensor layer and the cap layer; and a plurality of through trenches in the central portion of the sensor layer, the plurality of through trenches extending through the sensor layer from the first surface to the second surface, the plurality of through trenches, together, completely surrounding the platform housing the sensitive element of the sensor layer, each of the plurality of through trenches having portions that extend on opposing sides of an adjacent one of the plurality of through trenches, wherein the plurality of through holes, the air gap and the plurality of through trenches form a fluidic path to the sensitive element.

2. The sensor according to claim 1, comprising elastic connection regions in the sensor layer between the platform and the peripheral portion of the sensor layer, the plurality of through trenches being defined by the elastic connection regions.

3. The sensor according to claim 1, wherein the sensor layer has a buried cavity and a membrane arranged between the buried cavity and the first surface, the membrane housing the sensitive element.

4. The sensor according to claim 3, comprising a protection region fixed to the peripheral portion of the cap layer and facing the membrane.

5. The sensor according to claim 4, wherein the protection region is an ASIC or an auxiliary cap.

6. The sensor according to claim 1, comprising an encapsulation region of resin surrounding the peripheral portions of the sensor layer, the cap layer, and the insulating layer.

7. The sensor according to claim 1, wherein the sensor is a piezoresistive pressure sensor.

8. A process comprising:
   forming a stack that includes:
      a sensor layer having a peripheral portion surrounding a central portion;
      a cap layer having a peripheral portion and a central portion; and
      an insulating layer between the peripheral portions of the sensor layer and cap layer;
   forming a plurality of through holes in the central portion of the cap layer;
   forming a plurality of through trenches in the central portion in the sensor layer, the plurality of through trenches extending through an entire thickness of the sensor layer, the plurality of through trenches delimiting a platform in the sensor layer such that the plurality of through trenches, collectively, completely surround the platform and form a sensitive element in the sensor layer, at least one of the plurality of through trenches having portions that extend on opposing sides of an adjacent one of the plurality of through trenches; and
   forming an air gap between the central portions of the sensor layer and the cap layer, wherein the platform is in fluid communication with the plurality of holes in the cap layer through the air gap and the plurality of through trenches.

9. The process according to claim 8, wherein the stack is a SOI substrate.

10. The process according to claim 8, comprising forming, in the sensor layer, a buried cavity and a membrane facing the buried cavity, wherein the membrane is the sensitive element.

11. The process according to claim 10, further comprising fixing a protection region to a peripheral portion of the cap layer, the protection region facing the membrane.

12. The process according to claim 11, wherein the protection region is an ASIC or an auxiliary cap.

13. The process according to claim 8, wherein forming the plurality of through trenches comprises forming elastic connection regions extending into the sensor layer between the platform and the peripheral portion of the sensor layer.

14. The process according to claim 8, wherein forming a plurality of through holes comprises removing selective portions of the cap layer and exposing the insulating layer, and forming the air gap comprises partially removing the insulating layer by etching a central portion of the insulating layer through the plurality of holes.

15. The process according to claim 8, further comprising forming an encapsulation region of resin around peripheral portions of the sensor layer, the cap layer, and the insulating layer.

16. The process according to claim 8, wherein forming the air gap between the central portion of the sensor layer and the cap layer comprises removing a central portion of the insulating layer through the plurality of through holes of the cap layer.

17. An electronic device comprising: a microintegrated sensor including: a sensor layer including a first surface and a second surface opposite the first surface, the sensor layer including a central portion and a peripheral portion surrounding the central portion, the central portion including a membrane configured to move in response to a change in pressure, the central portion including a plurality of through trenches that collectively, together, surround the membrane and mechanically decouples the membrane from the peripheral portion, the plurality of through trenches extending from the first surface of the sensor layer to the second surface, each of the plurality of through trenches having sections that extend on opposing sides of a section of an adjacent one of the plurality of through trenches; a cap layer coupled to the sensor layer and including a peripheral portion and a central portion, the cap layer including a plurality of through openings in the central portion of the cap layer; an insulating layer between peripheral portions of the sensor layer and the cap layer, the insulating layer forming an air gap between the central portions of the membrane and the cap layer; and a fluid path including the plurality of through openings in the central portion, the air gap, and the plurality of through trenches in the central portion of the sensor layer, wherein the fluid path places the membrane in fluid communication with an environment outside of the microintegrated sensor; conductive bumps coupled to the microintegrated sensor; an ASIC coupled to the microintegrated sensor by the conductive bumps; encapsulation material surrounding side surfaces of the ASIC and the microintegrated sensor to form an electronic sensor package; and a microprocessor coupled to the electronic sensor package.

18. The electronic device according to claim 17, wherein the plurality of through trenches forms springs in the sensor layer.

19. The electronic device according to claim 17, wherein the membrane faces the ASIC, and the membrane is spaced apart from the ASIC by the conductive bumps to form a gap.

20. The electronic device according to claim 17, wherein the membrane is suspended by a buried cavity formed in the sensor layer.

21. The electronic device according to claim 17, further comprising a memory coupled to the microprocessor and an input/output interface coupled to the microprocessor.

22. The electronic device according to claim 17, wherein the sensor layer is a first semiconductor layer, wherein the cap layer is a second semiconductor layer.

23. The electronic device according to claim 17, wherein collectively, the plurality of through trenches completely surrounds the membrane.

24. The sensor according to claim 1, wherein the stack is a SOI substrate.

25. The electronic device according to claim 17, wherein the sensor layer, the insulating layer, and the cap layer collectively form a SOI substrate.

* * * * *